United States Patent [19]
Ranjan et al.

[11] Patent Number: 6,031,258
[45] Date of Patent: Feb. 29, 2000

[54] HIGH DC CURRENT STAGGER POWER/ GROUND PAD

[75] Inventors: Nalini Ranjan; Henry Yang; Yi-Hen Wei; Gregg Bardel, all of San Jose, Calif.

[73] Assignee: S3 Incorporated, Santa Clara, Calif.

[21] Appl. No.: 09/036,351

[22] Filed: Mar. 6, 1998

[51] Int. Cl.[7] .................................................. H01L 27/10
[52] U.S. Cl. ........................ 257/203; 257/781; 257/786; 257/775
[58] Field of Search ................................ 257/207, 781, 257/203, 786, 775

[56] References Cited

FOREIGN PATENT DOCUMENTS

| 431490 | 6/1991 | European Pat. Off. | 257/203 |
| 6-112407 | 4/1994 | Japan | 257/203 |

*Primary Examiner*—David B. Hardy
*Attorney, Agent, or Firm*—Fenwick & West LLP

[57] ABSTRACT

Improved conductive pads and conductive lines for use on integrated circuit chips include one or more conductive layers having a wider width than convention conductive lines for improved current and power carrying capacity. A layer of insulating and shock resistant is included over said layers of wider width, and additional pads can be formed on said layer of insulating and shock resistant material. Additional improved conductive pads are formed on the integrated circuit chip over a region containing a conductive line. The improved pads and conductive lines provide high power and current carrying capacity, and simultaneously allow for high pad density on an integrated circuit chip. Said pads and conductive lines can include a layer of metal which is electrically insulated using upper and lower layers of insulating material, with this layer of metal providing shock resistance particularly to such lower layer of insulating material.

17 Claims, 3 Drawing Sheets

HIGH DC CURRENT STAGGER POWER/ GROUND PAD

BACKGROUND OF THE INVENTION

1. Field of the Invention

The present invention relates to circuitry for interconnecting integrated circuit (IC) chips with other circuitry. More particularly, the present invention relates to input, output, and power supply pads formed on an IC chip, and to electrically conductive lines used to carry electrical signals or power from such pads to circuitry on the IC chip. Still more particularly, the present invention relates to such pads and electrically conductive lines having increased current and power carrying capacity.

2. Description of the Related Art

In order to receive and supply signals and power, IC chips include a plurality of metal pads to which wires from other circuitry can be bonded. Such a pad typically comprises a rectangular layer or layers of metal formed on the surface of the IC chip, with each edge of such rectangular layers being in a range from about 100 to 150 microns. The pads are generally arranged in concentric rectangular rings around the periphery of the IC chip. The pads in each ring are spaced apart to prevent electrical conduction directly between pads, with such spacing typically being in a range from about 150 to 200 microns. Each pad is connected to other circuitry on the IC chip by an electrically conductive line which typically comprises one or more layers of metal formed on the surface of the IC chip.

Complex IC chips often have more than one such ring of pads. Where more than one ring is used, the pads in each ring are often staggered. For example, where two rings of pads are used, each pad of an outer ring is disposed adjacent to a spacing between two pads of an inner ring. This allows the conductive lines for the outer ring to fit between the pads of the inner ring, and thus prevents electrical conduction directly between a pad of the inner ring and an electrical conduction line for a pad of the outer ring. Staggering pads helps to increase the number of pads possible on each chip by allowing for two or more concentric rings of pads on the same IC chip.

Compared to the size of typical transistors of an IC chip, pads are extremely large. Consequently, IC chips can become pad limited. This basically means that the pads are taking up a large percentage of the available space on the surface of the IC chip, thus limiting the amount of space remaining to hold other circuitry. One way of alleviating this problem is to allow a pad to perform more than one function. For example, it is common to connect a pad to an input/output buffer.

The input/output buffer allows the pad both to output signals from the IC chip and to receive signals for the IC chip.

While using input/output buffers helps to reduce the number of pads used for carrying signals, it does not help to reduce the number of pads used for supplying power to an IC chip. The amount of power that a single pad can supply to the IC chip is generally limited by the size of the conductive line connected to that pad. A wider conductive line typically can carry more power than a narrower line. However, in the conventional staggered pad configuration described above, the width of the conductive lines is limited by the spacing between the pads of an inner ring or rings. To increase the width of such a conductive line beyond this limit, the spacing between pads must be increased, thus reducing the total number of pads possible on the IC chip.

There is thus a continuing need in the field of integrated circuit electronics for pads and conductive lines that can carry increased quantities of power and current to an IC chip without the need for increasing the spacing between pads encountered in convention IC chip design. Such improved pads and conductive lines should preferably be able to reduce the total number of pads required for supplying power to the IC chip, and thus free space on the IC chip for either additional circuitry or additional pads for carrying signals. Such improved pads should also preferably be usable for supplying power, carrying signals, or both.

SUMMARY OF THE INVENTION

The present invention provides improved pads and conductive lines for use on IC chips. These improved pads and conductive lines can carry increased current and power levels compared to conventional output pads and conductive lines. However, unlike conventional output pads, this increased current and power carrying capacity does not require increased spacing between pads.

One embodiment of an improved pad and conductive line of the present invention comprises: a multi-layer metallic pad having a bottom surface formed on an integrated circuit chip, and having a top surface for connecting to circuitry off the integrated chip; and a multi-layer metallic conductive line formed on the integrated circuit chip and interconnected with the conductive pad. All layers of the pad have the same rectangular shape. One end portion of the conductive line is connected with and incorporated into the structure of the pad along an edge of the pad to allow electrical conduction between the pad and the conductive line.

Most of the length of a bottom layer or layers of the conductive line is at least as wide as said edge of the pad for increased current and power carrying capacity. However, said end portion of these bottom layers of the conductive line can have reduced width substantially equal in size to the length of said edge of the pad, which improves electrical isolation of the conductive line from other pads, and thus allows for increased total pad density on the IC chip.

To prevent the bottom layers of the conductive line from short circuiting with other circuitry due to their increased width, a layer of insulating and shock resistant material of the present invention is formed on top of portions of the conductive line. Such an insulating and shock resistant layer can be formed by forming a first layer of insulating material over such portions of the conductive line, forming a second layer of metal over the first layer of insulating material, and forming a third layer of insulating material over the second layer of metal. The second layer of metal increases resistance of the first layer of insulating material to cracking. Additional pads can be formed on top of the second layer of insulating material without inducing short circuits between the additional pads and the conductive line. The second layer of metal prevents short circuits caused by thermal shock or pressure applied to such an additional pad. For example, thermal shock and pressure encountered in bonding wires to such an additional pad typically will not short circuit the additional pad with the conductive line. Even if such thermal shock and pressure induces a short circuit of the additional pad with the second layer of metal, the first layer of insulating material still prevents a short circuit with the conductive line.

Another embodiment of the present invention comprises improved pads and conductive lines formed over other conductive lines. These improved pads and conductive lines can include additional regions of metal formed along side the other conductive lines. The additional regions of metal present a substantially flat surface over which the improved conductive line is formed. It is believed that the substantially flat surface reduces the likelihood of short circuits forming between these improved conductive lines and the second layer of metal described above. Short circuiting between such additional regions of metal and the second layer of metal described above is believed to be harmless because the additional regions of metal typically are not used to carry signals or power for the IC chip.

The present invention thus provides improved pads and conductive lines for use on IC chips. These improved output pads and conductive lines can be incorporated on IC chips also having conventional output pads and conventional conductive lines. The improved output pads generally do not require special buffering. They are compatible with most semi-conductor technologies, including Complementary Metal Oxide Silicon (CMOS) and bipolar. The improved output pads of the present invention are highly beneficial when used as power supply pads, because of their increased power and current carrying capacity. For example, these pads are well suited both as HIGH voltage or POWER pin pads and as LOW voltage or GROUND pin pads. For many IC chip designs, the improved output pads and conductive lines can be used to reduce the total number of pads required to supply power to the IC chip, thus freeing space for additional signal carrying pads and other circuitry, as well as allowing for smaller total chip area.

BRIEF DESCRIPTION OF THE DRAWINGS

FIG. 3 further illustrates the relative vertical position of additional pads of the present invention and improved conductive line of the present invention.

DETAILED DESCRIPTION OF THE INVENTION

Figure 1:
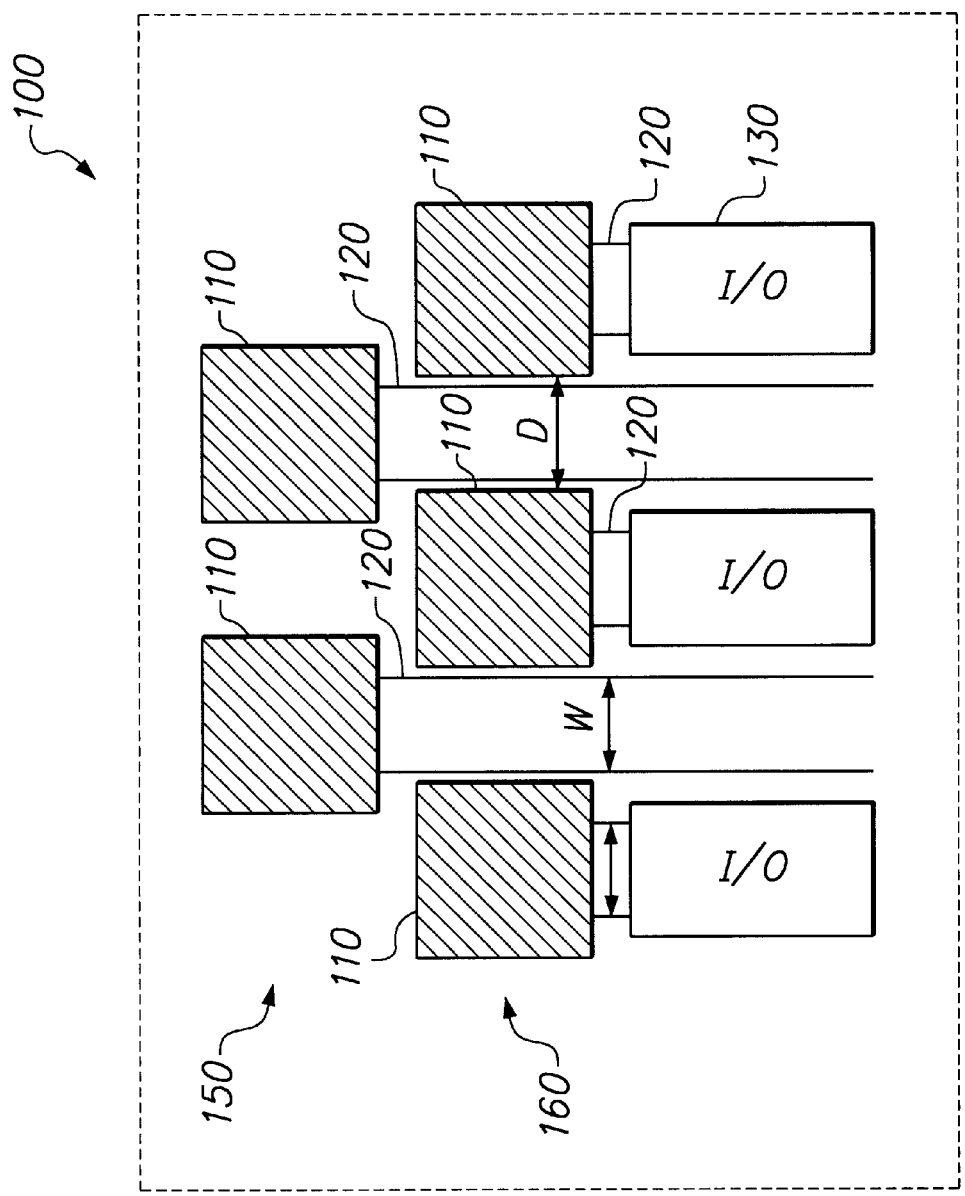
FIG. 1 is a block diagram of a conventional staggered pad and conventional conductive line configuration also illustrating a plurality of input/output buffers for receiving and supplying signals for the pads.

Referring now to FIG. 1, there is shown a plurality of conventional conductive pads 110, conductive lines 120, and input/output buffers 130 abutting one edge of an IC chip 100. The pads 110 are arranged in two concentric rings 150, 160, with pads 110 of the outer ring 150 being staggered with respect to pads 110 of the inner ring 160. Thus, except at corners (not shown) of the IC chip 100, each pad 110 of the outer ring 150 is disposed adjacent to a spacing between two pads 110 of the inner ring 160. This allows the conductive lines 120 for the pads 110 of the outer ring 150 to fit between the pads 110 of the inner ring 160, and thus prevents electrical conduction directly between a pad 110 of the inner ring 160 and a conductive line 120 for a pad 110 of the outer ring 150.

The pads 110 and conductive lines 120 of both rings 150, 160 are formed from a plurality of layers of metal. These layers of metal are formed in conventional manner on the IC chip 100 during fabrication. Typically, there is no insulating material between the layers of metal forming a pad 110, and the pad 110 is essentially a single thick layer of metal. There can be insulating material between the layers of metal forming the conductive lines 120. Damage to such insulating material typically does not adversely impact performance of the IC chip 100, because the various layers of metal in a conductive line 120 are already electrically interconnected with each other at a pad 110.

In FIG. 1, the pads 110 of the inner ring 160 are each coupled to an input/output buffer 130. This allows these pads 110 to receive and supply signals for the IC chip 100. The pads 110 of the outer ring 150 are used to supply power to the IC chip 100. The level of power which the pads 110 of the outer ring 150 can supply to the IC chip 100 is determined in part by the width W of the conductive lines 120 to the outer ring 150. If this width W is too narrow, electrical current in these conductive lines 120 will over time cause metal atoms in these lines 120 to migrate away from there proper locations. This process is commonly referred to as metal migration. The current essentially erodes the conductive lines 120 which eventually causes them to fail.

Unfortunately, the width W of the conductive lines 120 for the pads 110 of the outer ring 150 is limited by the distance D between the pads 110 of the inner ring 160. Wider conductive lines 120 for the outer ring 150 can be formed if the distance D between the pads 110 of the inner ring 160 is also increased. However, increasing the distance D between pads 110 of the inner ring 160 necessarily reduces the total number of pads 110 that can fit in the inner ring 160. This results in a tradeoff between current carry capacity of the conductive lines 120 and the number of pads 110 on the IC chip 100. Typically, two pads 120 are required to supply power for each pad 110 that is used to carry signals to or from the IC chip 100. There is thus an increasing need in the area of semi-conductor electronics for improved pads and conductive lines that can carry higher levels of power and current than conventional pads 110 and conductive lines 120.

Figure 2:
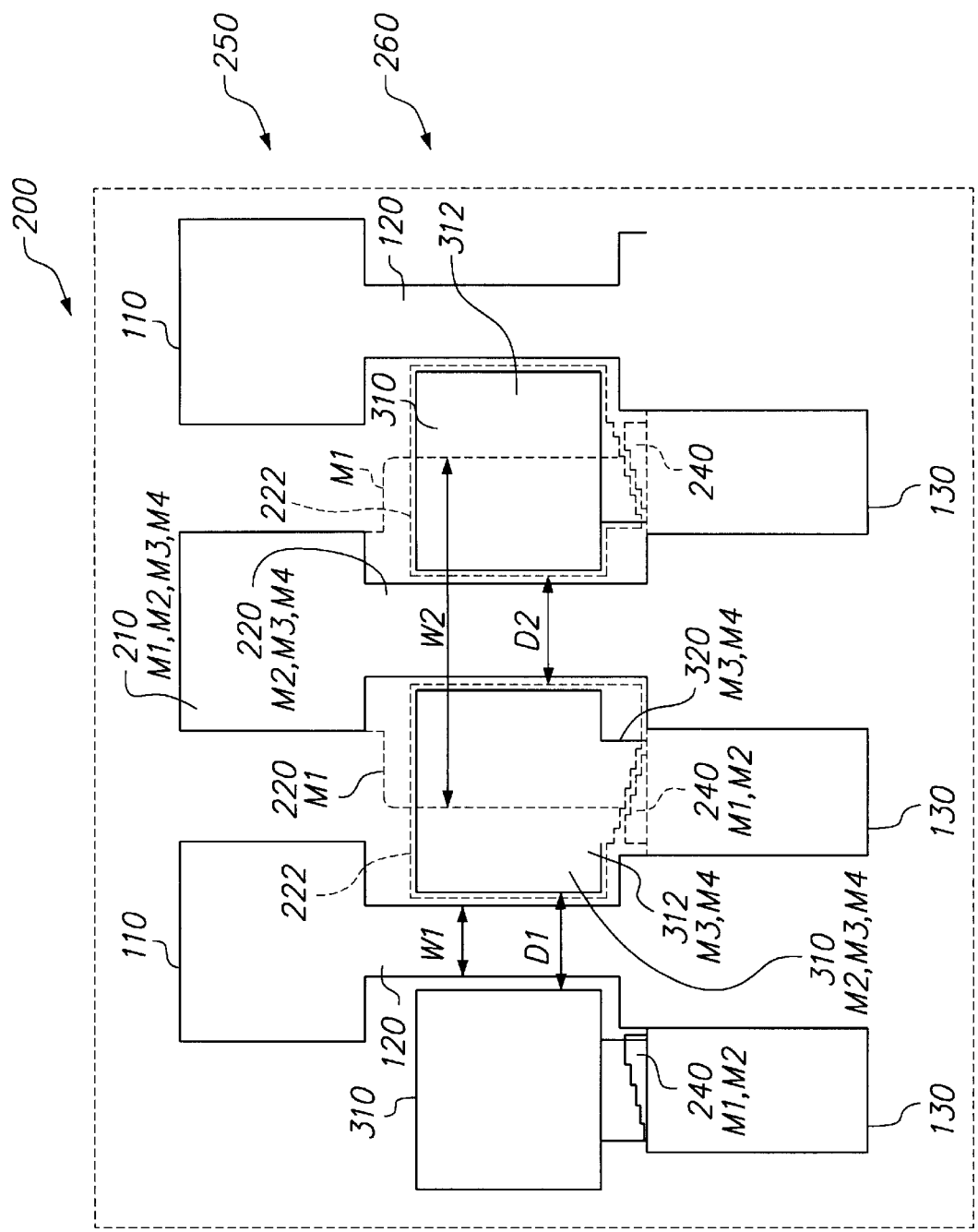
FIG. 2 is a top view of a portion of an IC chip including a first embodiment of improved pads and conductive lines of the present invention and showing relative positions of various layers of metal of the conductive lines.

Referring now to FIG. 2, there is shown a second IC chip 200 including both conventional pads 110 and conductive lines 120, and preferred embodiments of improved pads 210, 310 and conductive lines 220, 320 of the present invention. The various pads 110, 210, 310 are arranged in two concentric rings 250, 260, with the pads 110, 210 of the outer ring 250 being staggered with respect to the pads 310 of the inner ring 260. The improved pad 210 of the present invention comprises multiple layers of metal M1, M2, M3, M4, with the M1 layer being formed on the IC chip, the M2 layer being formed on top of the M1 layer, the M3 layer being formed on top of the M2 layer, and the M4 layer being formed on top of the M3 layer. Layers of insulating material can be included between these layers of metal M1, M2, M3, M4 with electrical interconnections being provided between the layers of metal MI, M2, M3, M4. The conductive lines 120, 220, 320 illustrated in FIG. 2 are also formed from these layers of metal M1, M2, M3, M4. However, it is also in conformance with the present invention to fabricate the pads 210, 310 separately from the conductive lines 220, 320, for example, by using different layers of metal for the pads 210, 310 than for the conductive lines 220, 320, and appropriately interconnecting the pads 210, 310 with the respective conductive lines 220, 320.

The various layers of metal M1, M2, M3, M4 also form the conventional pads 110 and conductive lines 120 illustrated in FIG. 2. The conventional conductive lines 120 each have a narrow width W1 which allows each of these conductive lines 120 to fit between two of the pads 310 of the inner ring 260. However, this is not entirely true for the improved pad 210 of the present invention. In particular, the layer of metal M1 of the improved pad 210 widens to the width W2 to comprise a first layer of the improved conductive line 220 of the present invention. In the illustrated embodiments of the present invention, this first layer M1 of the improved conductive line 220 is much wider than any of the layers of the conventional conductive line 120. This is possible because the layer of metal M1 of the improved conductive line 220 is not limited by the distance D2 between the pads 310 of the inner ring 260. Because this first layer of metal M1 of the improved conductive line 220 is much wider than the various layers of the conventional conductive line 120, the improved conductive line 220 can carry much more current and power than the conventional conductive line 120. For example, where the distances D1, D2 between pads 310 of the inner ring 260 are the same, it is believed that the improved conductive line 220 can carry at least three times the maximum direct current of the conventional conductive line 120.

The improved conductive line 220 of the present invention further comprises additional layers of metal M2, M3, M4 extending from the improved conductive pad 210. These three additional layers of metal M2, M3, M4 are disposed over the first layer M1 of the improved conductive line 220, but are narrower than this first layer of metal M1, and fit between the pads 310 of the inner ring 260 like the conventional conductive line 120. These additional layers of metal M2, M3, M4 of the improved conductive line 220 improve the current and power carry capacity of the conductive line 220. Additional current and power carrying capacity can be achieved by including additional wide layers of metal in the improved conductive line 220.

Unlike conventional pads 110, the improved pads 310 are formed on top of other circuitry. In particular, these improved pads 310 are formed on top of portions 222 of the layer of metal M1 of the improved conductive line 220, with the layers of metal M2, M3, and M4 of the improved conductive line 220 being disposed in the space between two of the improved pads 310 of the inner ring 260. The improved conductive lines 320 of the present invention couple the improved pads 310 to input/output buffers 130, which allows the improved pads 310 to both receive and supply signals for the IC chip 200. These improved conductive lines 320 are positioned partially over said portions 222 of the layer of metal M1, in the manner illustrated.

Figure 3:
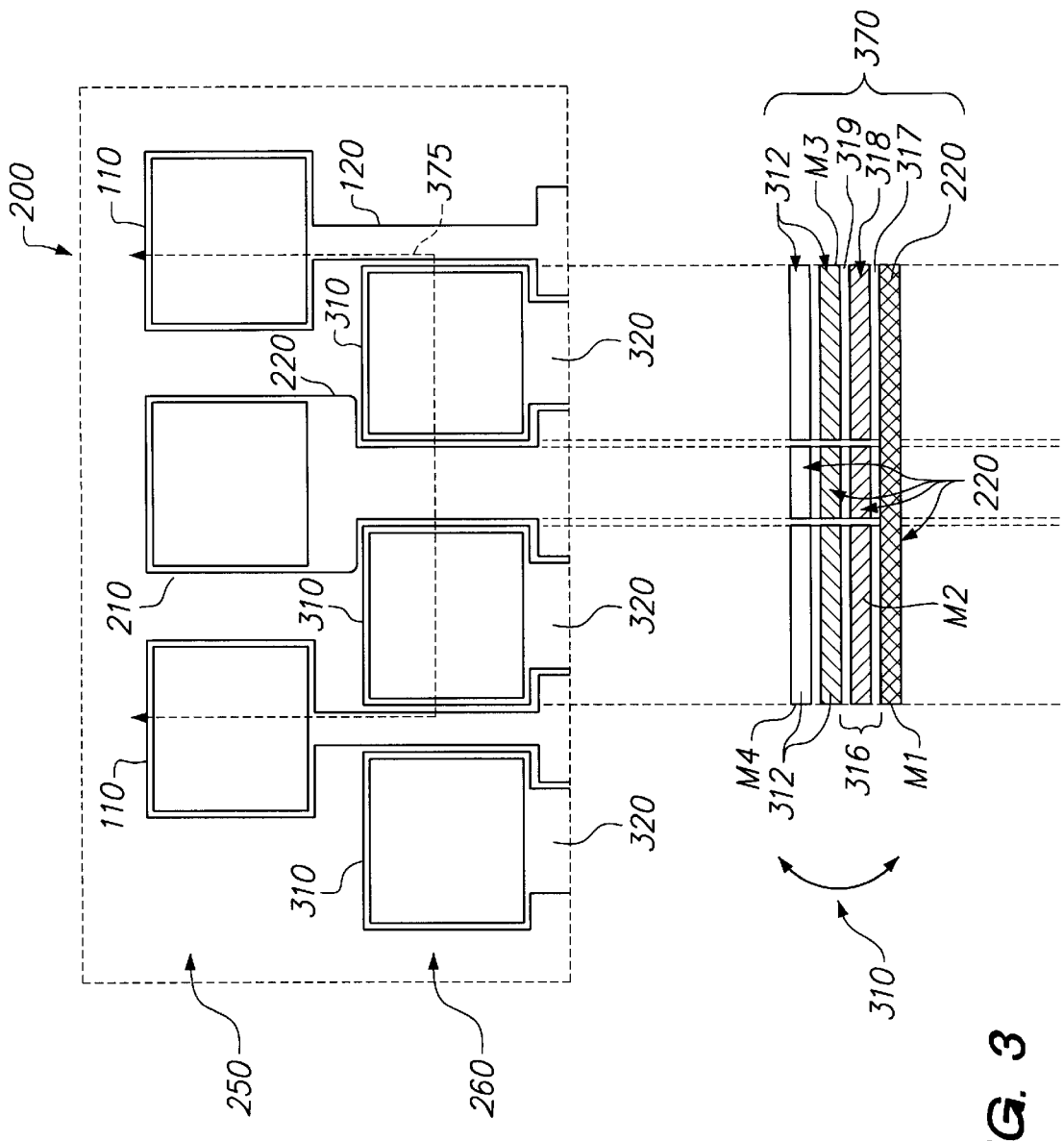
FIG. 3 is a partial top view of the portion of the IC chip illustrated in FIG. 2 after fabrication of the layer of metal M4, and of a vertical cross-section of the improved pads and conductive lines of FIG. 2.

Referring now also to FIG. 3 there is shown a partial top view the IC chip 200 illustrated in FIG. 2 which includes illustration of the conventional pads 110 and conductive lines 120, and the improved pads 210,310 and conductive lines 220, 320 after fabrication of the layer of metal M4. This illustration also includes a vertical cross section 370 of the IC chip 200, and illustrates the various layers of metal M1, M2, M3, M4 at that cross section 370. The cross section 370 illustrates that the layers of metal M2, M3, M4 of the improved conductive line 220 are disposed between the pads 310 of the inner ring 260. The cross section 370 further illustrates that the improved pads 310 of the present invention each comprise a layer of insulating and shock resistant material 316 of the present invention and a metallic pad 312 of the present invention. The layer of insulating and shock resistant material 316 is formed on top of the improved conductive line 220, and the metallic pad 312 is formed on top of this layer of insulating and shock resistant material 316. However, this layer of insulating and shock resistant material 316 extends beyond edges of the metallic pad 312 and beneath the improved conductive line 320.

In this embodiment of the improved pads 310 of the present invention, the layer of insulating and shock resistant material 316 comprises a first layer of insulating material 317 formed on top of the portions 222 of the layer of metal M1 of the improved conductive line 220, a layer 318 of metal M2 formed on top of the first layer of insulating material 317, and a second layer of insulating material 319 formed on top of the layer 318 of metal M2. The first and second layers of insulating material 317, 319 insulate the layer 318 of metal M2 from the improved conductive line 220 and the metallic pad 312 respectively. The layer 318 of metal M2 preferably is floating; that is, it preferably is not coupled to received signals or power from other circuitry. Thus, even if the second layer of insulating material 319 between the rectangular metallic pad 312 and the layer 318 of metal M2 is damaged, the metallic pad 312 will still be insulated from the improved conductive line 220 by the first layer of insulating material 317. Similarly, if the first layer of insulating material 317 is damaged, the metallic pad 312 will still be insulated from the improved conductive line 220 by the second layer of insulating material 319. The layer 318 of metal M2 also supplies shock resistance particularly to the first layer of insulating material 317, and also to the second layer of insulating material 319. Due to these properties, it is believed that damage to both the first and second layers of insulating material 317, 319 is highly unlikely to occur, and that the metallic pad 312 will be very well insulated from the improved conductive line 220 with a high degree of certainty. These properties are particularly beneficial because typical processes for bonding external wiring to pads can subject pads to significant heat and downward pressure.

The metallic pad 312 of the present invention comprises two layers of metal M3, M4, and unlike conventional pads, is formed over other circuitry of the IC chip 200. The layer of metal M4 of this pad 312 can be formed directly on the layer M3, or alternatively, the layers M3, M4 of this pad 312 can be separated by a layer of insulating material having conductive paths formed therein which supply an electrical connection between the layers M3, M4 of the pad 312.

The improved conductive lines 320 each comprise layers of metal M3, M4 extending from an improved pad 310 to an input/output buffer 130 of the IC chip 200. Below a portion of each conductive line 320 is a region 240 of metal M1, M2 which adjoins an edge of the first layer of metal M1 of the improved conductive line 220. This region of metal 240 and the layer of insulating and shock resistant material 316 together form a substantially flat surface on which is formed the improved conductive line 320. This substantially flat surface prevents kinking of the improved conductive line 320 at said edge of the first layer of metal M1 of the improved conductive line 220. Consequently, metal migration in the improved conductive line 320 is avoided.

In the illustrated embodiment of the improved pads 310, the improved conductive lines 320 extending therefrom do not have extended width, and are thus preferably incorporated as signal carrying pads. Nonetheless, because these improved pads 310 are disposed over the improved conductive lines 220, space is saved on the IC chip 200 relative to conventional pads 110. The improved pads 310 can also incorporate alternative embodiments of the improved as conductive lines 320 having wider layers of metal for improved current and power carrying capacity, and such embodiments of the improved pads 310 and conductive lines 320 are ideal for supplying power to the IC chip 200.

The various layers of metal M1, M2, M3, M4 comprising the various embodiments of the present invention can comprise respectively conventional metal1, metal2, metal3, metal4 layers, where metalN refers in conventional manner to an Nth layer of metal on an IC chip. However, the present invention is not limited by this exemplary structure. For example, the layers of metal M1, M2, M3, M4 can be formed from metal2, metal3, metal5, metal6 respectively. Further, the insulating and shock resistant material 316 can include two or more layers of metal for improved shock resistance, as well as additional layers of insulating material for improved insulation of the improved pad 310 from the improved conductive line 220.

There are thus presented improved pads 210 and conductive lines 220 of the present invention that can beneficially carry increased levels of power and current relative to conventional pads 110 and conductive lines 120. Improved pads 310, 312 and conductive lines 320 of the present invention are also presented that are disposed on top of conductive lines 210. These latter pads 310, 312 and conductive lines 320 allow for increased pad density on an IC chip 200, are ideally suited for carrying signals to and from the IC chip 200, but can be modified for carry power to the IC chip 200. Also presented are insulating and shock resistant layers 316 comprising a layer or layers 318 of metal which provide shock resistance to a layer or layers 317, 319 of insulating material.

While the present invention has been described with respect to certain preferred embodiments thereof, those skilled in the art will recognize that various modifications may be provided. For example, while various of the pads and conductive lines are described herein as individual components, those skilled in the art will recognize that one or more layers of such pads and conductive lines can be formed together as a continuous layer of metal; that is, using a integrated or single piece construction. These and other variations upon and modifications to the preferred embodiments are provided by the present invention, which is limited only by the following claims.

What is claimed is:

1. A circuit for interconnecting an integrated circuit chip with other circuitry, the circuit comprising:
   a pad having a bottom surface formed on the integrated circuit chip, and a conductive top surface for connecting to circuitry off the integrated chip; and
   a conductive line formed on the integrated circuit chip, the conductive line having a bottom surface with a bottom width coupled to the bottom surface of the pad, and a top surface with a top width coupled to the conductive top surface of the pad, wherein the bottom width of the bottom surface of the conductive line is greater than the top width of the top surface of the conductive line for increasing current carrying capacity of the conductive line.

2. The circuit of claim 1, wherein the conductive line comprises at least one layer of metal deposited on the integrated circuit chip.

3. The circuit of claim 1, wherein the pad is disposed to receive power from the circuitry off the integrated circuit chip, and the bottom width of the bottom surface of the conductive line increases a quantity of power that can be supplied from the pad to circuitry on the integrated circuit chip.

4. The circuit of claim 3, wherein the pad is coupled to a HIGH voltage source off the integrated circuit chip.

5. The circuit of claim 3, wherein the pad is coupled to a LOW voltage source off the integrated circuit chip.

6. The circuit of claim 1, further comprising:
   a layer of insulating and shock resistant material formed on top of a portion of the conductive line; and
   a second pad formed at least partially on top of the layer of insulating and shock resistant material, with the layer of insulating and shock resistant material insulating the second pad from the conductive line.

7. The circuit of claim 1, further comprising:
   a first layer of insulating material formed on top of a portion of the conductive line;
   a layer of metal formed on top of the first layer of insulating material for providing shock resistance to the first layer of insulating material;
   a second layer of insulating material formed on top of the layer of metal; and
   a second pad formed at least partially on top of the second layer of insulating material, the second layer of insulating material insulating the second pad from the layer of metal.

8. The circuit of claim 1, further comprising:
   a layer of insulating material formed on top of the conductive line;
   a layer of shock resistant material formed on top of a portion of the layer of insulating material; and
   a second pad formed at least partially on top of the layer of shock resistant material.

9. The circuit of claim 8, wherein the layer of shock resistant material further comprises:
   a layer of metal formed on top of the layer of insulating material for increasing resistance of the layer of insulating material to cracking; and
   a second layer of insulating material formed on top of the metal line for insulating the metal line from the second pad.

10. A conductive line for an integrated circuit chip comprising:
    a first layer of conductive material formed on the integrated circuit chip for carrying electrical current between portions of said chip; said first layer of conductive material having a first width;
    a second layer of insulating material formed on top of the first layer of conductive material for insulating said first layer of conductive material;
    a third layer of floating metal formed on top of the second layer and covering the first layer for protecting the second layer of insulating material from cracking;
    a fourth layer of insulating material formed on top of the third layer of floating metal for insulating said third layer of floating metal; and
    a fifth layer of conductive material formed on top of said fourth layer of insulating material, said fifth layer of conductive material having a second width;
    wherein the first width of the first layer of conductive material is greater than the second width of the fifth layer of conductive material.

11. A semiconductor integrated circuit device comprising:
    a first row of pads and a second row of pads, said first row of pads and said second row of pads disposed along a periphery of said semiconductor integrated circuit, said second row of pads disposed inside of and staggered from said first row of pads; and
    a conductive line coupled to at least one pad in the first row of pads, the conductive line comprising a bottom layer having a bottom width and a top layer having a top width, the bottom width of the bottom layer of the conductive line being greater than the top width of the top layer of the conductive line for increasing current carrying capacity of the conductive line.

12. The device of claim 11 wherein at least one pad in the second row of pads overlaps a portion of the bottom layer of the conductive line.

13. The device of claim 11, wherein the conductive line further comprises:

a layer of insulating and shock resistant material formed on top of the conductive line.

14. A semiconductor integrated circuit device comprising:

a first row of pads and a second row of pads, said second row of pads disposed inside of and staggered from said first row of pads;

a first conductive line coupled to a first pad in the first row of pads, the first conductive line having a first width; and a second conductive line coupled to a second pad in the first row of pads, the second conductive line having a second width; the first width of the first conductive line being greater than the second width of the second conductive line for increasing current carrying capacity of the first conductive line.

15. The device of claim 14 wherein the first width of the first conductive line is formed in a first layer of metal.

16. The device of claim 14, wherein the conductive line further comprises:

a layer of insulating and shock resistant material formed on top of the first and second conductive lines.

17. The device of claim 14 wherein at least one pad in the second row of pads overlaps a portion of the first conductive line.

* * * * *